(12) United States Patent  
Cho et al.

(10) Patent No.: US 7,733,088 B2  
(45) Date of Patent: Jun. 8, 2010

(54) MRI SYSTEM RF COIL ASSEMBLY WITH A BIRDCAGE TRANSMIT ONLY COIL AND A PSEUDO-CHAIN-LINK RECEIVE ONLY COIL ARRAY

(75) Inventors: Zang Hee Cho, Incheon (KR); Young Bo Kim, Seongnam-si (KR); Kyoung Nam Kim, Incheon (KR); Suk Min Hong, Incheon (KR)

(73) Assignee: Gachon University of Medicine & Science Industry - Academic Cooperation Foundation, Incheon (KR)

( * ) Notice: Subject to any disclaimer, the term of this patent is extended or adjusted under 35 U.S.C. 154(b) by 0 days.

(21) Appl. No.: 12/177,653

(22) Filed: Jul. 22, 2008

(65) Prior Publication Data

US 2009/0134873 A1 May 28, 2009

(30) Foreign Application Priority Data

Nov. 22, 2007 (KR) .................. 10-2007-0119877

(51) Int. Cl.  
*G01V 3/00* (2006.01)  
*A61B 5/055* (2006.01)

(52) U.S. Cl. .................. 324/318; 324/322; 324/309; 600/422

(58) Field of Classification Search ......... 324/300–322, 324/200; 600/410, 411, 422  
See application file for complete search history.

(56) References Cited

U.S. PATENT DOCUMENTS

| 5,635,837 | A  | 6/1997  | Bornert |
| 6,160,400 | A  | 12/2000 | Friedrich et al. |
| 6,608,480 | B1* | 8/2003 | Weyers ................ 324/318 |
| 6,900,636 | B2 | 5/2005  | Leussler |
| 6,946,840 | B1 | 9/2005  | Zou et al. |

(Continued)

FOREIGN PATENT DOCUMENTS

DE 197 27 524 C1 3/1999

(Continued)

OTHER PUBLICATIONS

Krestel, E., "Imaging System for Medical Diagnostics," 2nd Edition, Berlin, Munich: Siemens Corporation, 1988, pp. 510-523 (ISBN 3-8009-1505-7).

*Primary Examiner*—Brij B. Shrivastav  
*Assistant Examiner*—Tiffany A Fetzner  
(74) *Attorney, Agent, or Firm*—Patterson, Thuente, Christensen, Pedersen, P.A.

(57) ABSTRACT

There is provided an RF (radio frequency) coil assembly of a magnetic resonance imaging (MRI) system, which comprises a birdcage transmit-only coil using inhomogeneous modes. Further, a multi-channel receive-only phased array coil is provided. In one embodiment, the multi-channel receive-only phased array coil may include a plurality of ring-shaped receive-only coils, wherein the receive-only coils are connected to each other in a pseudo-chain-link configuration to form a ring shape. The multi-channel receive-only phased array coil may be located inside said transmit-only coil and spaced a predetermined distance apart therefrom. In accordance with the embodiments, emphasis images of the peripheral part of a human brain with high resolution and high signal to noise ratio may be obtained.

9 Claims, 7 Drawing Sheets

U.S. PATENT DOCUMENTS

| | | | |
|---|---|---|---|
| 7,253,622 B2 * | 8/2007 | Saylor et al. | 324/318 |
| 7,449,886 B2 * | 11/2008 | Buchwald | 324/311 |
| 7,449,888 B1 * | 11/2008 | Malik et al. | 324/318 |
| 2006/0103386 A1 * | 5/2006 | Buchwald | 324/318 |
| 2006/0158189 A1 * | 7/2006 | Saylor et al. | 324/318 |
| 2006/0214661 A1 | 9/2006 | Steen et al. | |
| 2007/0013377 A1 * | 1/2007 | Wosik et al. | 324/322 |
| 2008/0007250 A1 * | 1/2008 | Wiggins | 324/200 |
| 2008/0129298 A1 * | 6/2008 | Vaughan et al. | 324/322 |
| 2008/0284435 A1 * | 11/2008 | Overweg et al. | 324/318 |
| 2009/0015256 A1 * | 1/2009 | Bottomley et al. | 324/309 |
| 2009/0134873 A1 * | 5/2009 | Cho et al. | 324/318 |

FOREIGN PATENT DOCUMENTS

| | | |
|---|---|---|
| EP | 1 279 968 A2 | 1/2003 |
| JP | 07-100123 | 4/1995 |
| JP | 07-308304 | 11/1995 |
| JP | 2006-014823 | 1/2006 |
| KR | 1999-0079479 | 11/1999 |

* cited by examiner

MRI SYSTEM RF COIL ASSEMBLY WITH A BIRDCAGE TRANSMIT ONLY COIL AND A PSEUDO-CHAIN-LINK RECEIVE ONLY COIL ARRAY

The present application claims priority to Korean Patent Application No. 10-2007-0119877 entitled "RF COIL ASSEMBLY FOR MAGNETIC RESONANCE IMAGING SYSTEM" filed on Nov. 22, 2007, the entire content of which is incorporated herein by reference.

BACKGROUND

1. Field

The present invention generally relates to a radio frequency (RF) coil of a magnetic resonance imaging (MRI) system. More particularly, the present invention relates to a multi-channel phased array coil for obtaining an emphasis image of cerebral cortex of a human brain in a high magnetic field MRI system.

2. Background

A magnetic resonance imaging (MRI) system is widely used in the field of medical diagnosis due to its capability of providing 3-dimensional and/or high-resolution images without harming a human body. In particular, a high magnetic field (e.g., 7 Tesla) MRI system is attracting attention in the field since it can provide images with higher signal to noise ratio (SNR) and higher resolution compared to a low magnetic field (e.g., 1.5 Tesla or 3 Tesla) MRI system. Further, the high magnetic field (7 Tesla) MRI system can provide images of cerebral cortex, thereby making it possible to provide better medical services to patients with brain diseases.

A radio frequency (RF) coil of an MRI system is generally used to form RF field to excite spins of a region of interest ("ROI") (i.e., a region whose images are intended to be acquired) and to detect the variation of the magnetic field from the spins, which precess due to the RF field. To obtain images of high quality in the MRI system, the RF coil should meet the following two requirements. First, for transmission purposes, the coil should be able to form a homogeneous magnetic filed at the ROI to excite protons of nuclei. Second, for reception purposes, the coil should be able to acquire RF signals with the same gain at the ROI.

In a conventional MRI system, a coil for both transmission and reception is used to obtain images of a human brain. In the low magnetic field MRI system, the magnetic field generated by the RF coil, which is exclusively used for a human brain, is homogeneous over the wide range. However, in the high magnetic field MRI system with the frequency of 300 MHz or above, it is impossible for the conventional coil for both transmission and reception to form a homogeneous magnetic field inside the human brain. This is accounted by the phenomenon in which the effective RF wavelength is shortened due to the permittivity of the human brain positioned at the interior of the RF coil. The shortened wavelength results in standing waves inside the human brain. As a result, the periphery of the image becomes dark while the center part of the image is bright, which makes the diagnosis difficult.

Furthermore, it is difficult to develop RF coils used in the high magnetic field MRI system compared to those used in the low magnetic field MRI system. As discussed below, there are several reasons for such difficulty.

First, the wavelength of the signals in the high magnetic field MRI system is shortened. This is because the resonance frequency is proportional to the magnitude of the magnetic field. In case of low frequency AC signals, the signal wavelength is not a concern since it is considerably longer than the size of the circuits or lines. However, when the frequency is higher than 300 MHz, the wavelength is shortened to the order of centimeters. Thus, a phase superposition occurs on the lines. In the case of low-frequency signal with long wavelength, the waveform distortion is negligible in spite of the superposition of the AC waveforms on the lines because the phase shift is slight. However, in case of high-frequency signal with short wavelength, the signal waveform may experience severe distortion with the result that the original waveform may not be maintained due to the superposition with different phases. In order to avoid such a problem, the size of the circuit should be reduced. Further, all dimensions of the circuit including its length and size should be downsized when designing the coils.

Second, a crosstalk increases as the frequency increases. Even in the case of low-frequency signals, the interference (i.e., crosstalk) between lines exists. However, as the frequency is higher, even the non-substantial part of the coil (i.e., the part which does not conduct transmitting or receiving signals) acts as the substantial part of the coil, thus radiating more electromagnetic energy. As a result, the coupling at the RF circuit becomes more important. That is, along with the wavelength problem, the design of RF coil circuit becomes more like a structural design. Further, there are many cases of circuit designing in the RF coils using such a coupling.

Third, a high antenna gain should be provided. Since the signals transmitted and received by the RF coil are wireless signals in most cases, the coil should have a small size due to the specification requited in real use. However, the smaller the size of the coil is, the smaller the gain is. Accordingly, more sophisticated technologies should be integrated to provide a higher gain with smaller size when designing the RF coil.

Fourth, the effect of the external noise should be considered. The resonator has a predetermined bandwidth centering around the center frequency. Theoretically, to obtain the maximum signal to noise ratio (SNR) when designing the resonator, the reflection coefficient is designed to approach infinity at the desired frequency. Also, it is designed to be like noise at other frequencies. However, it is practically impossible to realize such a circuit. Thus, the resonator is inevitably affected by the external noise. Furthermore, since the bandwidth becomes wider as the frequency is further increased (e.g., if the bandwidth corresponds to 1% of the frequency, the bandwidth is 3 MHz at the frequency of 300 MHz used in the high magnetic field MRI system, while the bandwidth is 100 kHz at the frequency of 10 MHz), the effect of the external noise increases. Thus, the SNR of the overall circuit decreases. Although such a problem relates to the frequency rather than the design of the RF coil structure, it is one of the most important factors to be considered when designing the resonator. Although using a narrow bandwidth at a high frequency makes it possible to obtain a high SNR, it is very difficult to implement such a circuit which can use a narrow bandwidth with respect to the frequency. Even if such a circuit is implemented, it may be sensitive to a variation of the external conditions.

In order to address and resolve the above-mentioned problems, the present invention provides a radio frequency (RF) coil with high signal to noise ratio (SNR) and high resolution to emphasize the cerebral cortex of a human brain in a high magnetic field (7 Tesla) magnetic resonance imaging (MRI) system.

BRIEF DESCRIPTION OF THE DRAWINGS

Arrangements and embodiments will be described in detail with reference to the following drawings in which like reference numerals refer to like elements and wherein.

DETAILED DESCRIPTION

Figure 1:
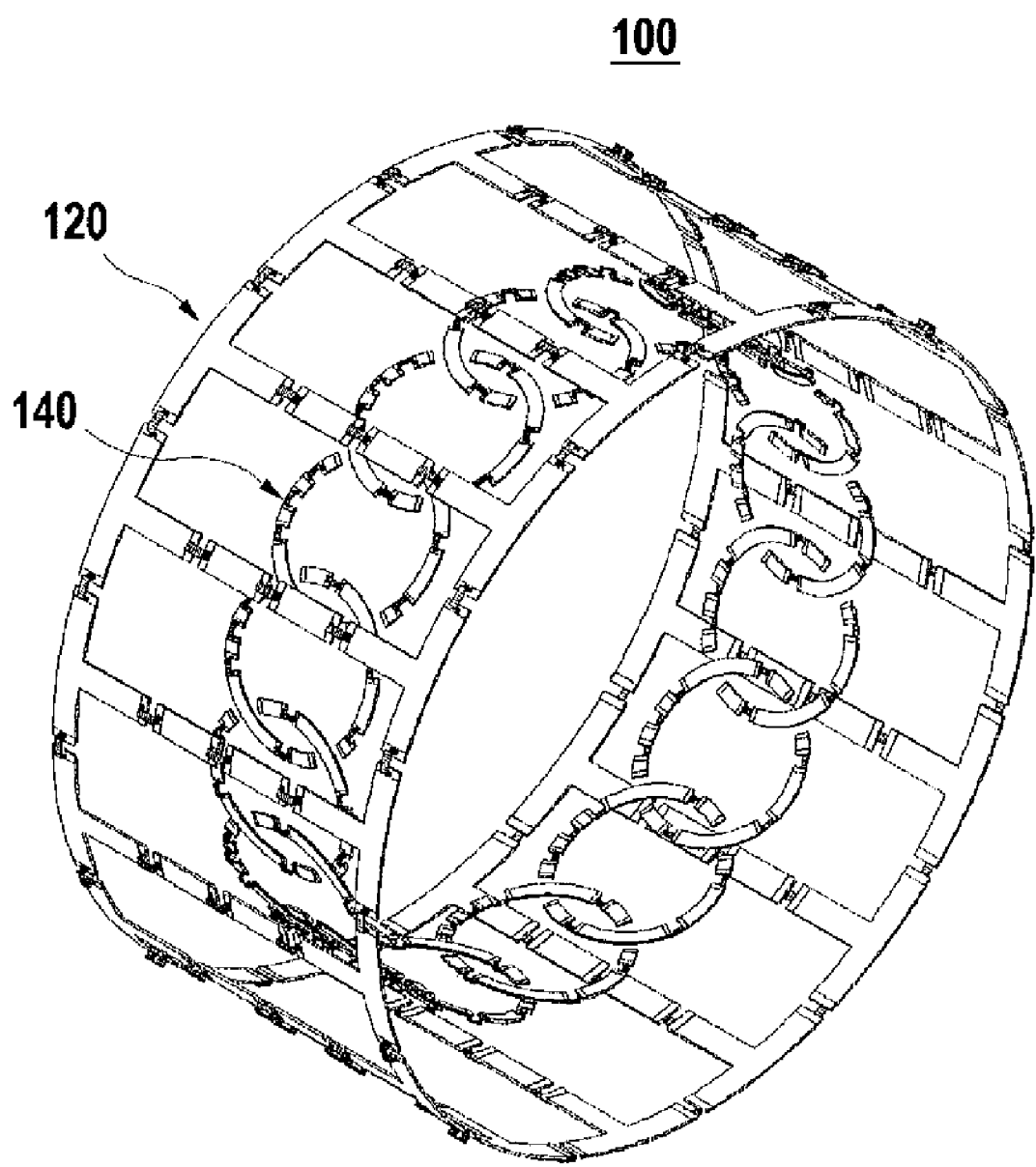
FIG. 1 is a perspective view of an RF coil assembly in accordance with one embodiment of the present invention.

A detailed description will be provided with reference to the accompanying drawings. It will be readily understood that the components of the present disclosure, as generally described and illustrated in the Figures herein, could be arranged and designed in a wide variety of different configurations. Thus, the following detailed description of the embodiments in accordance with the present disclosure, as represented in the Figures, is not intended to limit the scope of the disclosure, as claimed, but is merely representative of certain examples of embodiments in accordance with the disclosure. The presently described embodiments will be best understood by reference to the drawings, wherein like parts are designated by like numerals throughout.

In accordance with one embodiment of the present invention, an RF (radio frequency) coil assembly of a magnetic resonance imaging (MRI) system may comprise a birdcage transit-only coil. Further, a multi-channel receive-only phased array coil is provided. In one embodiment of the present invention, the multi-channel receive-only phased array coil may include a plurality of ring-shaped receive-only coils, wherein the receive-only coils are connected to each other in a pseudo-chain-link configuration to form a ring shape. In one embodiment of the present invention, the multi-channel receive-only phased array coil may be located inside said transmit-only coil and spaced a predetermined distance apart from the transmit-only coil.

According to one embodiment of the present invention, images of a peripheral part of a human brain with high SNR and high resolution may be obtained by using a transmit coil having inhomogeneous modes and a multi-channel receive coil (instead of a two-way (transmit and receive) coil) in an MRI system. In one embodiment of the present invention, the transmit coil may be located outside of the receive coil.

In one embodiment of the present invention, the filling factor may be maximized for each transmit coil and receive coil. The filling factor represents a proportion of the volume of a coil to the volume of a subject (phantom). As the filling factor increases, the sensitivity of the coil increases. Thus, the SNR also increases to thereby result in strong signals. Since the intensity of the RF signal generated by the subject, i.e., the RF signal received by the receive coil, is more dominant than the transmit energy used to convert the energy of the protons of the subject from the ground state to the excited state, the sensitivity may be determined based on the distance between the receive coil and the subject.

In one embodiment of the present invention, the receive-only coil is configured to obtain images of the cerebral cortex of a human brain. Sixteen (16) receive coils may be arranged with the same phase difference between the two consecutive coils at the periphery of the human brain. The receive-only coil may obtain the RF signal generated when the proton energy state is transmitted from the excited state to the ground state after being transmitted from the ground state to the excited state due to the energy delivered from the transmit-only coil to the subject. In case of the transmit-only coil, if a uniform mode is artificially used, then a uniform energy may be provided to the overall brain. However, in accordance with one embodiment of the present invention, a birdcage transmit-only coil may be designed to obtain a stronger signal at the peripheral part of the human brain by being optimized as an inhomogeneous mode, i.e., a gradient mode.

In one embodiment of the present invention, the birdcage coil is based on the theory of transmission line manufactured with lumped element component. The signal to noise ratio (SNR) and the B1 field homogeneity of the birdcage coil are superior to those of the other shape of volume antennas.

Hereinafter, an embodiment of the present invention will be described in detail with reference to the accompanying drawings. However, it should be understood that the present invention is not limited to the embodiment described below.

Figure 2:
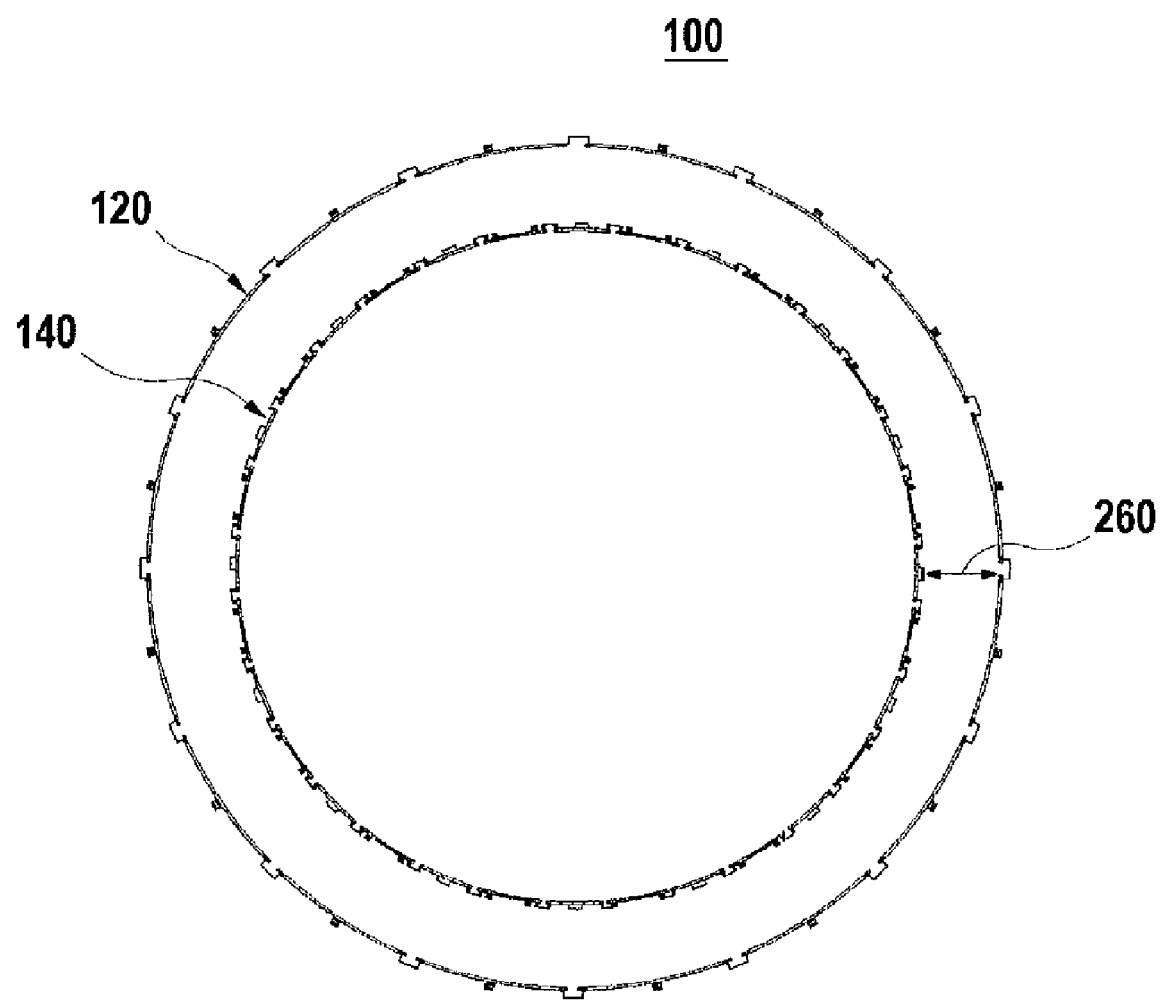
FIG. 2 is a plane view of an RF coil assembly in accordance with one embodiment of the present invention.

FIG. 1 is a perspective view of an RF coil assembly for obtaining images of a peripheral part of a human brain in a 7 Tesla magnetic resonance imaging (MRI) system in accordance with one embodiment of the present invention. FIG. 2 is a plane view of the RF coil assembly shown in FIG. 1. As illustrated in FIGS. 1 and 2, an RF coil assembly 100 in accordance with one embodiment of the present invention may include a birdcage transmit-only coil 120 in the form of a quadrature coil having an inhomogeneous mode (i.e., a gradient mode) and a 16-channel receive-only phased array coil 140 in one space. In one embodiment of the present invention, when a subject enters the hollow space provided inside the RE coil assembly 100 of the MRI system, an image of the inside of the subject may be taken by using the signals transmitted and received by the transmit-only coil 120 and the receive-only phased array coil 140. That is, when the transmit-only coil 120 delivers energy to protons in the subject, the protons of the subject may transit to the excited state. Thereafter, if the power supplied to the transmit-only coil 120 becomes cut-off by using an external switching circuit, the receive-only phased array coil 140 may receive RF signals to render an image of the subject.

In one embodiment of the present invention, the transmit-only coil 120 and the receive-only phased array coil 140 may be separated from each other. As shown in FIG. 2, the inner diameter of the receive-only phased array coil 140 is shorter than that of the transmit-only coil 120. Further, the receive-only phased array coil 140 may be spaced apart from the transmit-only coil 120 and coaxially disposed inside the transmit-only coil 120. The inner diameter of the receive-only phased array coil 140 is relatively smaller so as to obtain RF signals from the subject without any loss by receiving stronger signals in the position closer to the subject.

Further, the distance where the transmit-only coil 120 and the receive-only phased array coil 140 are spaced apart is referred to as an effective range, which is pointed out by reference numeral 260 in FIG. 2. In one embodiment of the present invention, the effective range 260 may be determined so as to minimize the mutual inductance between the transmit-only coil 120 and the receive-only phased array coil 140.

Figure 3:
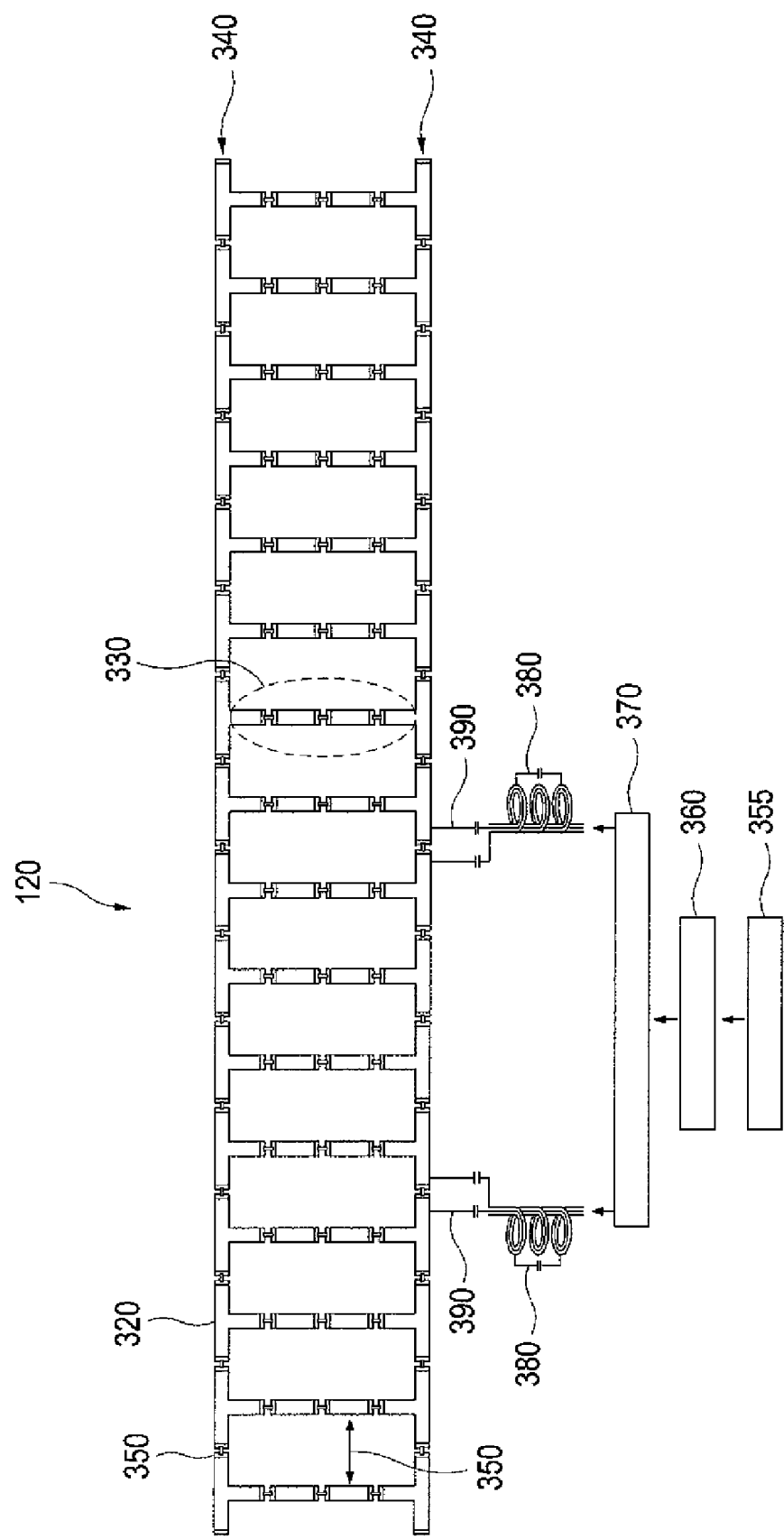
FIG. 3 is a 2-dimensional development view of a birdcage transmit-only coil in accordance with one embodiment of the present invention.
Figure 4:
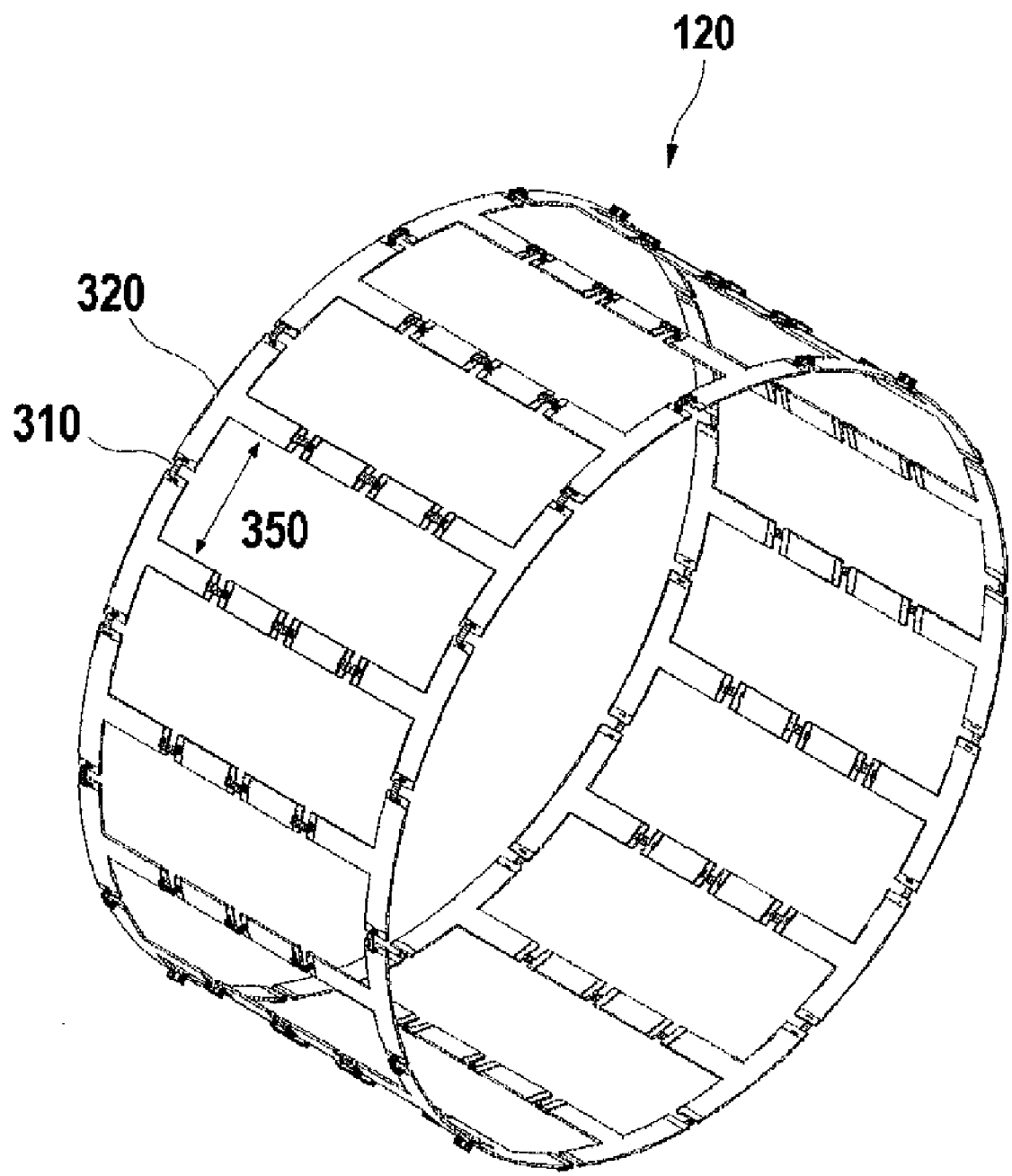
FIG. 4 is a perspective view of a birdcage transmit-only coil in accordance with one embodiment of the present invention.

FIG. 3 is a 2-dimensional development view of a birdcage transmit-only coil in accordance with one embodiment of the present invention. FIG. 4 is a perspective view of the birdcage transmit-only coil in accordance with one embodiment of the present invention. As shown in FIGS. 3 and 4, the birdcage transmit-only coil 120 may include inductors 320 and capacitors 310 disposed between any two consecutive inductors. The birdcage structure may comprise one or more rungs 330, which substantially form a magnetic field, and end-rings (ERs) 340 that are used as a current path. The space between the two consecutive rungs 330 is referred to as a window angle, which is pointed out by reference numeral 350 in FIGS. 3 and 4.

In one embodiment of the present invention, when imaging parameters are determined with respect to a region of interest (ROI), a console (not shown) may determine the shape of an RF pulse. Further, a signal generator inside a spectrometer 355 may generate a digital signal in the form determined by the console. A digital to analog converter (DAC) inside the spectrometer 355 may convert the generated digital signal into an analog signal. A modulator inside the spectrometer 355 may modulate the converted analog signal with the carrier wave. The modulation process is necessary because the energy of the actual baseband signal (MR signal) is too weak for the RE coil to transmit the spin of the subject from the ground state to the excited state.

According to one embodiment of the present invention, the gain of the analog signal, which is modulated by the modulator of the spectrometer 355, may be increased by a radio frequency amplifier 360. In one embodiment of the present invention, the gain increase at the radio frequency amplifier 360 may be about 60 dB (input to output).

The birdcage transmit-only coil 120 may be operated both in linear polarization and circular polarization. The circular polarization may improve the signal to noise ratio by about 40%. Thus, as shown in FIG. 3, to make the circular polarization, the output of the radio frequency amplifier 360 may be divided by two at a quadrature hybrid coupler 370 and then applied to the birdcage transmit-only coil 120.

Preferably, the output of the quadrature hybrid coupler 370 may be applied to the birdcage transmit-only coil 120 via a noise reduction filter (shield suppression cable traps) 380, which is used to reduce the noise disposed at the shield of the coaxial cable.

In one embodiment of the present invention, the birdcage transmit-only coil 120 may be further connected to impedance matching circuits 390 for impedance matching with the quadrature hybrid coupler 370. The impedance matching circuits 390 may minimize the power loss by receiving all signals without reflecting in case the impedance is matched with a predetermined impedance. According to one embodiment of the present invention, the predetermined impedance may be 50 ohm.

In one embodiment of the present invention, the end-rings (ERs) 340, which are the current path of the birdcage transmit-only coil 120, may be circular conductive loops. Preferably, the end-rings (ERs) 340 may be used as simple current paths without forming magnetic field by the current.

In one embodiment of the present invention, to implement a quadrature antenna, the rungs 330 may be manufactured such that the number of rungs 330 is a multiple of four (4). Particularly, it may be effective for forming homogeneous magnetic field with high signal to noise ratio to allow the number of rungs 330 to be sixteen (16). According to one embodiment of the present invention, sixteen rungs 330 may be positioned at regular intervals on the end-rings 340. As such, the transmit-only coil 120 is implemented as a band pass filter (BPF) in the form of the birdcage.

In one embodiment of the present invention, to obtain an emphasis image of a peripheral part of a human brain, inductors 320 and capacitors 310 may be disposed so that the transmitted signal can be focused to the peripheral part of the human brain. Preferably, the inductors 320 and the capacitors 310 may be disposed so as to form the magnetic field only at the outer part rather than forming the homogeneous magnetic field by using an inhomogeneous mode, i.e., a gradient mode (instead of a uniform mode), which forms magnetic field uniformly inside the coil. The mode of antenna relates to a phenomenon in which the energy is focused at a certain frequency for an antenna with a certain structure. A resonance frequency and a resonance configuration are determined by such mode of the antenna. In one embodiment of the present invention, a response curve of the impedance for the frequency band of the manufactured birdcage coil in the form of BPF may show that the reflection coefficient is high at several frequencies. By selecting an inhomogeneous mode among these frequencies and then tuning the selected frequency to the central frequency of the system, the desired mode may be obtained.

Figure 7:
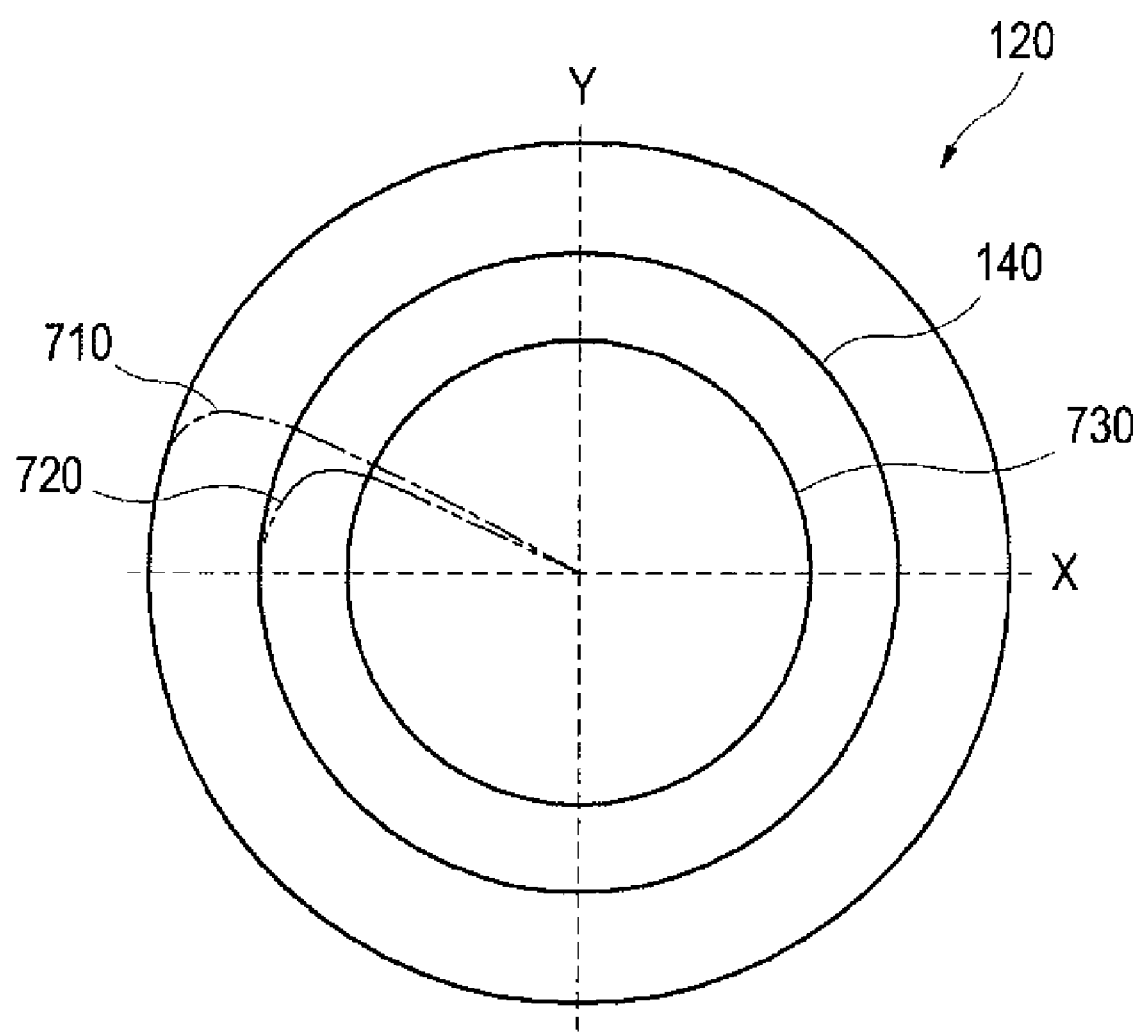
FIG. 7 is a graph showing a magnitude of the magnetic field of a transmit-only coil and a receive-only coil in accordance with one embodiment of the present invention.

FIG. 7 is a graph showing a magnitude of the magnetic field of a transmit-only coil and a receive-only coil in accordance with one embodiment of the present invention. In FIG. 7, the X-axis represents a distance from the center and the Y-axis represents the strength of the signal. As shown in FIG. 7, when a transmit coil 120 forms a magnetic field at a subject 730, the strength of the signal is sharply decreased from the outer part of the transmit coil 120 to the central part thereof (710). However, the magnitude of the magnetic field at the outer part can be greater compared to a case using the uniform mode.

Figure 5:
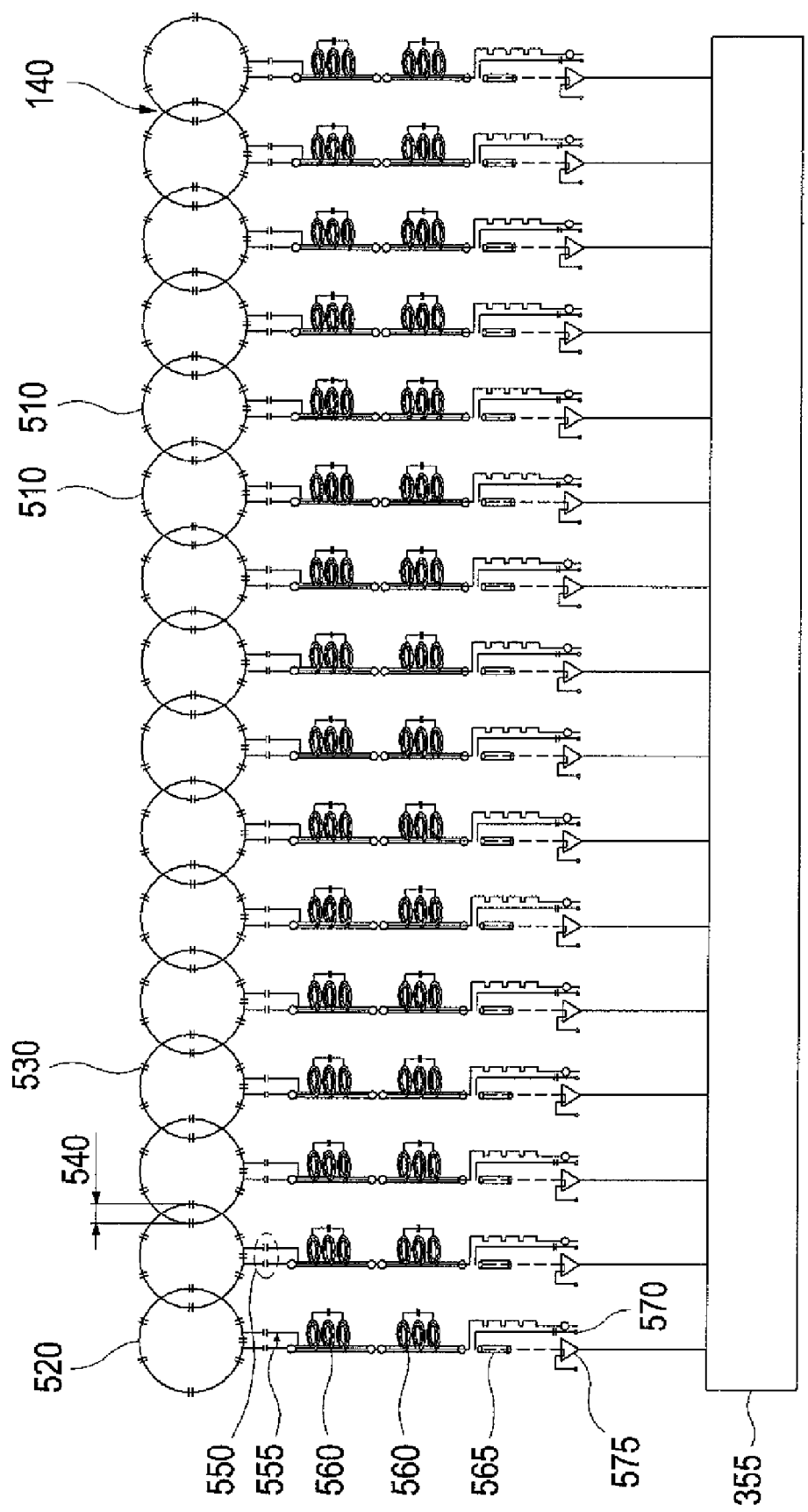
FIG. 5 is a 2-dimensional development view of a receive-only phased array coil in accordance with one embodiment of the present invention.
Figure 6:
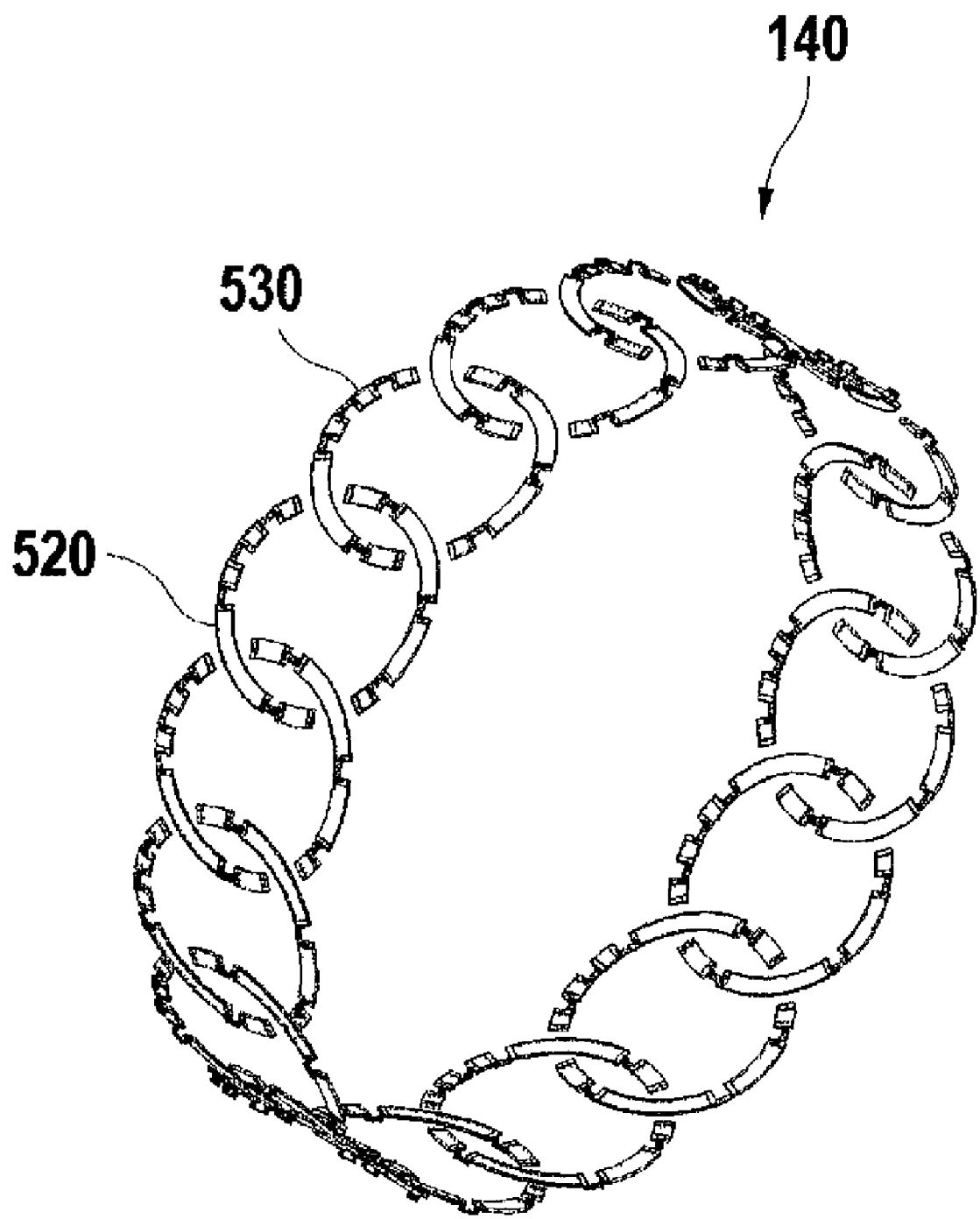
FIG. 6 is a perspective view of a receive-only phased array coil in accordance with one embodiment of the present invention.

FIG. 5 is a 2-dimensional development view of a receive-only 16-channel phased array coil for obtaining emphasis images of a peripheral part of a human brain in a 7 Tesla MRI system in accordance with one embodiment of the present invention. FIG. 6 is a perspective view of the receive-only 16-channel phased array coil for obtaining the emphasis images of the peripheral part of the human brain in the 7 Tesla MRI system in accordance with one embodiment of the present invention. As shown in FIGS. 5 and 6, the receive-only 16-channel phased array coil 140 may include sixteen (16) receive coils 510, each of which includes an inductor 520 and a capacitor 530. The receive-only 16-channel phased array coil 140 may allow signals to be obtained only at the outer part of a subject, thereby obtaining images wherein the human brain is emphasized. Preferably, the receive-only 16-channel phased array coil 140 may be ring-shaped, in which the sixteen receive coils 510 are connected to each other in a pseudo-chain-link configuration. Further, as shown in FIG. 6, the pseudo-chain-link configuration may preferably be a configuration where the ring-shaped receive coils 510 are disposed so as to be superposed on the neighboring receive coils 510 while being spaced apart by a predetermined interval 540. Preferably, the interval 540 may be determined so as to minimize the mutual inductance between the adjacent receive coils 510.

In one embodiment of the present invention, the receive coils 510 may be further connected to impedance matching circuits 550 for impedance matching with the other circuits connected to the receive coils 510. The impedance matching circuits 550 may minimize the power loss by receiving all the signals without reflecting in case the impedance is matched with a predetermined impedance. According to one embodiment of the present invention, the predetermined impedance may be 50 ohm.

In one embodiment of the present invention, PIN diodes 555 may be used to separate the receive coils 510 from the transmit coil. This is because the receive coils 510 are RF coils only for receiving and should be operated independently from the transmitting. In one embodiment of the present invention, when a DC bias circuit 570 applies DC bias to the RF coil, the RF signal may be transferred to the transmit coil, while the receive coil may be designed to be off by placing the PIN diode in an opposite direction to isolate the two coils, thereby minimizing the spatial inductance. Such a circuit is referred to as a detuning circuit. Without the detuning circuit, when the transmit coil forms the magnetic field, the receive coil may not be detuned. Thus, the RF energy may be transferred to the receiving end and the signal to noise ratio may be decreased. As such, system failure may occur.

In one embodiment of the present invention, noise reduction filters (shield suppression cable trap) 560 may be connected to each of the receive coils 510 to reduce the noise. This is because the received signal is small to thereby be sensitive to the external noise. According to one embodiment of the present invention, the received signal may be passed through two stages of the noise reduction filters 560 and a coaxial cable 565. It may then be applied to a low input impedance preamplifier 575. In case the receive coils 510 are circled as a form of circular belt as illustrated in FIG. 6, the mutual inductance between the adjacent coils may be minimized by adjusting the interposed distance 540 between the receive coils 510. However, the mutual inductance between the non-adjacent coils may be minimized by using such low input impedance preamplifiers 575.

According to one embodiment of the present invention, the signal first amplified by the low input impedance preamplifiers 575 may be further amplified by a preamplifier (not illustrated) inside the spectrometer 355. The signal amplified by the preamplifier inside the spectrometer 355 may be converted into a digital signal at an analog digital converter (ADC) inside the spectrometer 355. It may then be transferred to the console (not illustrated). In one embodiment of the present invention, the console may display images based on the received digital signal.

In one embodiment of the present invention, as shown in FIG. 7, radio frequency (RF) signal at the receive-only phased array coil 140 may be formed strong near the subject 730 (720). Thus, an emphasis image of the peripheral part of a human brain may be obtained.

The 16-channel phased array coil of 7 Tesla MRI system in accordance with embodiments of the present invention may receive signal, which is strong only at the peripheral part of a human brain, thereby improving resolution and signal to noise ratio of the image of the peripheral part of the human brain. This obtains emphasis images of the cerebral cortex of the human brain, thereby facilitating the diagnosis of disease of cerebrum. Diseases of peripheral part of the human brain, i.e., cerebral cortex, including frontal lobe, temporal lobe, parietal lobe and occipital lobe, etc. could not be identified by the conventional low-resolution images. However, in accordance with embodiments of the present invention, by using multi-channel receive-only phased array coil of high-resolution and transmit-only coil using inhomogeneous modes, emphasis images of the cerebral cortex of a human brain may be obtained. Thus, it is possible to offer better medical services to patients with brain diseases.

The foregoing merely describes some exemplary embodiments of the present invention. From the above descriptions, accompanying drawings and claims, those skilled in the art can readily recognize that various modifications can be made without departing from the spirit and scope of the appended claims. The above descriptions are thus to be regarded as illustrative rather than limiting.

What is claimed is:

1. An RF coil assembly of a magnetic resonance imaging (MRI) system, comprising:

a birdcage transmit-only coil having a substantially cylindrical shaped defined by one or more rungs and one or more end rings; and a multi-channel receive-only phased array coil comprising a plurality of ring-shaped receive-only coils, wherein the receive-only coils are connected to each other in a pseudo-chain-link configuration to form a substantially cylindrical shape, each of the plurality of ring-shaped receive-only coils comprises arc-shaped segments, and the arc-shaped segments include inductive and capacitive segments, wherein said multi-channel receive-only phased array coil is shorter than and located coaxially inside a space defined by said one or more rungs of said cylindrical transmit-only coil and wherein said multi-channel receive-only phased array coil is spaced a predetermined distance apart therefrom.

2. The RF coil assembly of claim 1, wherein the predetermined distance between said multi-channel receive-only phased array coil and said transmit-only coil is set to minimize the mutual inductance therebetween.

3. The RF coil assembly of claim 1, wherein two adjacent receive-only coils have an overlapping portion, and wherein the width of the portion is set to minimize mutual inductance therebetween.

4. The RF coil assembly of claim 1, further comprising:

a spectrometer configured to generate an RF signal, modulate the generated signal with a carrier wave and output the modulated signal;

a radio frequency amplifier connected to said spectrometer and being configured to amplify the modulated signal;

a quadrature hybrid coupler connected to said radio frequency amplifier and being configured to divide the amplified signal into two radio signals;

noise reduction filters connected to the quadrature hybrid coupler and being configured to reduce noise from the divided radio signals; and impedance matching circuits connected between the respective noise reduction filters and the transmit-only coil.

5. the RF coil assembly of claim 1, wherein the number of said receive-only coils is a multiple of four (4).

6. The RF coil assembly of claim 1, wherein the number of said receive-only coils is sixteen (16).

7. The RF coil assembly of claim 1, further comprising:

a plurality of impedance matching circuits connected to the respective receive-only coils;

a plurality of PIN diodes connected to the respective impedance matching circuits;

a plurality of noise reduction filters connected to the respective PIN diodes;

a plurality of coaxial cables connected to the respective noise reduction filters;

a plurality of preamplifiers connected to the coaxial cables; and a spectrometer connected to the preamplifiers, wherein the RF signals from the respective receive-only coils are passed through the plurality of impedance matching circuits, noise-reduced at the noise reduction filters, passed through the coaxial cables, amplified at the preamplifiers and further amplified at the spectrometer.

8. The RF coil assembly of claim 7, wherein said preamplifiers comprise low input impedance preamplifiers.

9. The RF coil assembly of claim 1, wherein said transmit-only coil operates in an inhomogeneous mode.

* * * * *